United States Patent
Ren et al.

(10) Patent No.: US 11,536,993 B2
(45) Date of Patent: Dec. 27, 2022

(54) DISPLAY PANEL, FABRICATING METHOD THEREOF, DISPLAY DEVICE AND CHARGING METHOD THEREOF

(71) Applicants: Ordos Yuansheng Optoelectronics Co., Ltd., Inner Mongolia (CN); BOE Technology Group Co., Ltd., Beijing (CN)

(72) Inventors: Yanwei Ren, Beijing (CN); Jingyi Xu, Beijing (CN); Min Liu, Beijing (CN); Ruize Jiang, Beijing (CN); Yanan Yu, Beijing (CN)

(73) Assignees: Ordos Yuansheng Optoelectronics Co., Ltd., Inner Mongolia (CN); BOE Technology Group Co., Ltd., Beijing (CN)

( * ) Notice: Subject to any disclaimer, the term of this patent is extended or adjusted under 35 U.S.C. 154(b) by 821 days.

(21) Appl. No.: 16/344,468

(22) PCT Filed: Oct. 17, 2018

(86) PCT No.: PCT/CN2018/110710
§ 371 (c)(1),
(2) Date: Apr. 24, 2019

(87) PCT Pub. No.: WO2019/165785
PCT Pub. Date: Sep. 6, 2019

(65) Prior Publication Data
US 2021/0028649 A1    Jan. 28, 2021

(30) Foreign Application Priority Data
Mar. 1, 2018  (CN) .......................... 201810170434.4

(51) Int. Cl.
G02F 1/133    (2006.01)
H02J 50/10    (2016.01)
(Continued)

(52) U.S. Cl.
CPC .... G02F 1/13306 (2013.01); G02F 1/136209 (2013.01); H01L 27/326 (2013.01);
(Continued)

(58) Field of Classification Search
CPC combination set(s) only.
See application file for complete search history.

(56) References Cited

U.S. PATENT DOCUMENTS

2012/0069506 A1    3/2012    Lai et al.
2014/0049882 A1*   2/2014    Lin .................. H02J 50/10
                                              361/679.01
(Continued)

FOREIGN PATENT DOCUMENTS

CN    10-3376591     * 10/2013    ........... G02F 1/1335
CN    103376591 A      10/2013
(Continued)

OTHER PUBLICATIONS

International Search Report for PCT/CN2018/110710 dated Dec. 25, 2018.
(Continued)

Primary Examiner — Lauren Nguyen
(74) Attorney, Agent, or Firm — ArentFox Schiff LLP; Michael Fainberg

(57) ABSTRACT

A display panel and a method for fabricating the same, and a display device and a method for charging the same are provided. The display panel includes: an array substrate; an opposite substrate arranged opposite to the array substrate; a charging coil located between the array substrate and the opposite substrate, wherein the charging coil is configured to generate electrical energy through electromagnetic induction. In this way, a battery for charging the battery is integrated inside the display panel to thereby make the display panel thin and lightweight.

10 Claims, 9 Drawing Sheets

(51) Int. Cl.
　　　*H02J 50/00*　　　(2016.01)
　　　*G02F 1/1362*　　(2006.01)
　　　*H01L 27/32*　　　(2006.01)
　　　*H01L 51/52*　　　(2006.01)
　　　*H05K 1/18*　　　(2006.01)
　　　*H02J 7/00*　　　(2006.01)

(52) U.S. Cl.
　　　CPC ........ *H01L 51/5284* (2013.01); *H02J 50/005* (2020.01); *H02J 50/10* (2016.02); *H05K 1/189* (2013.01); *H02J 7/0042* (2013.01); *H05K 2201/10136* (2013.01)

(56) References Cited

U.S. PATENT DOCUMENTS

2017/0047361 A1* 2/2017 Xu .................... H01L 29/78678
2017/0077727 A1 3/2017 Kim et al.

FOREIGN PATENT DOCUMENTS

| CN | 103594023 A | 2/2014 | |
|----|---|---|---|
| CN | 106098702 A | 11/2016 | |
| CN | 106532307 A | 3/2017 | |
| CN | 108388037 A | 8/2018 | |
| JP | 2009-216441 | * 9/2009 | .............. G01T 7/00 |

OTHER PUBLICATIONS

Office Action for corresponding Chinese Application 201810170434.4 dated Mar. 5, 2019.

Office Action for corresponding Chinese Application 201810170434.4 dated May 20, 2019.

Decision of Rejection for corresponding Chinese Application 201810170434.4 dated Sep. 26, 2019.

* cited by examiner

DISPLAY PANEL, FABRICATING METHOD THEREOF, DISPLAY DEVICE AND CHARGING METHOD THEREOF

This application is a US National Stage of International Application No. PCT/CN2018/110710, filed Oct. 17, 2018, which claims priority to Chinese Patent Application No. 201810170434.4, filed with the Chinese Patent Office on Mar. 1, 2018, and entitled "Display panel, method for fabricating the same, and display device and method for charging the same", which is hereby incorporated by reference in its entirety.

FIELD

This disclosure relates to the field of semiconductor technologies, and particularly to a display panel, a method for fabricating the same, a display device and a method for charging the same.

BACKGROUND

As the high-sciences and technologies are innovating constantly, electronic products have been popularized gradually in our live. By way of an example, a mobile phone, a digital camera, a personal digital assistant, a walkman, etc., are popularly favored due to their low weight, small thickness, and small size. However the existing electronic product is generally charged by a wired charging battery using an electrical outlet and a connection line, but this is not convenient. If the pre-charged battery is exhausted but cannot be charged timely, then the electronic product cannot operate any longer, thus discouraging it from being accessed by its user. At present, a wireless charging function has been widely applied, but a display panel with the wireless charging function is so thick and heavy that it remains difficult to make the display panel thin and lightweight.

SUMMARY

An embodiment of this disclosure provides a display panel. The display panel includes: an array substrate; an opposite substrate opposite to the array substrate; and a charging coil between the array substrate and the opposite substrate, wherein the charging coil is configured to generate electrical energy to the display panel through electromagnetic induction.

Optionally in the embodiment of this disclosure, the display panel further includes a plurality of pixel elements, wherein an orthographic projection of the charging coil on the opposite substrate does not overlap with orthographic projections of the plurality of the pixel elements on the opposite substrate.

Optionally in the embodiment of this disclosure, the charging coil includes a plurality of sub-charging coil segments connected in sequence, and each of the sub-charging coil segments is located in a gap between adjacent pixel elements.

Optionally in the embodiment of this disclosure, the pixel elements are arranged in an array, and the charging coil is located in a gap between two adjacent rows or columns of the pixel elements.

Optionally in the embodiment of this disclosure, the plurality of sub-charging coil segments are arranged at a same layer, and made of a same material.

Optionally in the embodiment of this disclosure, the opposite substrate includes a first base substrate, and the charging coil is located on a side of the first base substrate facing the array substrate.

Optionally in the embodiment of this disclosure, the display panel further includes a black matrix located on the side of the first base substrate facing the array substrate, and an orthographic projection of the black matrix on the first base substrate covers an orthographic projection of the charging coil on the first base substrate.

Optionally in the embodiment of this disclosure, the charging coil is located between the first base substrate and a layer where the black matrix is located.

Optionally in the embodiment of this disclosure, the charging coil is located on the side of the layer where the black matrix is located away from the first base substrate.

Optionally in the embodiment of this disclosure, the array substrate includes a second base substrate, and the charging coil is located on a side of the second base substrate facing the opposite substrate.

Optionally in the embodiment of this disclosure, the charging coil directly contacts with the second base substrate.

Optionally in the embodiment of this disclosure, the display panel further includes two charging terminals on the array substrate, wherein one of the two charging terminals corresponds to an inner end of the charging coil, and the other charging terminal corresponds to an outer end of the charging coil; and the outer end and the inner end of the charging coil are electrically connected respectively with their corresponding charging terminals.

Optionally in the embodiment of this disclosure, the display panel further includes: a first coil lead corresponding to the inner end, a second coil lead corresponding to the outer end, and an insulation layer located between a layer where the first coil lead is located and a layer where the second coil lead is located; wherein the inner end and the outer end are electrically connected with the first coil lead and the second coil lead respectively through via-holes running through the insulation layer, the first coil lead is electrically connected with the charging terminal corresponding to the inner end, and the second coil lead is electrically connected with the charging terminal corresponding to the outer end.

Optionally in the embodiment of this disclosure, the insulation layer is a black matrix.

Correspondingly an embodiment of this disclosure further provides a display device including the display panel according to the embodiment of this disclosure.

Optionally in the embodiment of this disclosure, the display device further includes: a flexible printed circuit, a main board electrically connected with the flexible printed circuit, and a battery electrically connected with the main board; and two charging terminals on the array substrate are electrically connected with the main board through the flexible printed circuit, and electrically connected with the battery through the main board.

Correspondingly an embodiment of this disclosure further provides a method for fabricating a display panel. The method includes: forming a charging coil between an array substrate and an opposite substrate, wherein the charging coil is configured to generate electrical energy through electromagnetic induction.

Correspondingly an embodiment of this disclosure further provides a method for charging a display device. The method includes: charging the battery through the charging coil in another time than a display time and a touch time.

DETAILED DESCRIPTION

In order to make the objects, technical solutions, and advantages of the embodiments of this disclosure more apparent, the technical solutions according to the embodiments of this disclosure will be described below clearly and fully with reference to the drawings in the embodiments of this disclosure. Apparently the embodiments to be described are only a part but not all of the embodiments of this disclosure. Based upon the embodiments here of this disclosure, all of other embodiments which can occur to those ordinarily skilled in the art without any inventive effort shall come into the scope of this disclosure as claimed.

Unless defined otherwise, technical terms or scientific terms throughout this disclosure shall convey their usual meaning as appreciated by those ordinarily skilled in the art to which this disclosure pertains. The terms "first", "second", or the like throughout this disclosure do not suggest any order, number or significance, but is only intended to distinguish different components from each other. Alike the terms "include", "comprise", or the like refer to that an element or an item preceding to the term encompasses an element(s) or an item(s) succeeding to the term, and its (or their) equivalence(s), but shall not preclude another element(s) or item(s). The term "connect", "connected", or the like does not suggest physical or mechanical connection, but may include electrical connection no matter whether it is direct or indirect. The terms "above", "below", "left", "right", etc., are only intended to represent a relative positional relationship, and when the absolute position of an object as described is changed, the relative positional relationship may also be changed accordingly.

For the sake of clarity and conciseness of the following description of the embodiments of this disclosure, a detailed description of known functions and components will be omitted in this disclosure.

In order to provide a display device with a wireless charging function, a charging coil is generally arranged in a main board in the display device configured to control the display device to operate, so a large space has to be occupied in the main board by the charging coil, thus making it difficult to make the display device thin and lightweight. In view of this, the embodiments of this disclosure provide a display panel so as to make the display device thin and lightweight.

Figure 1A:
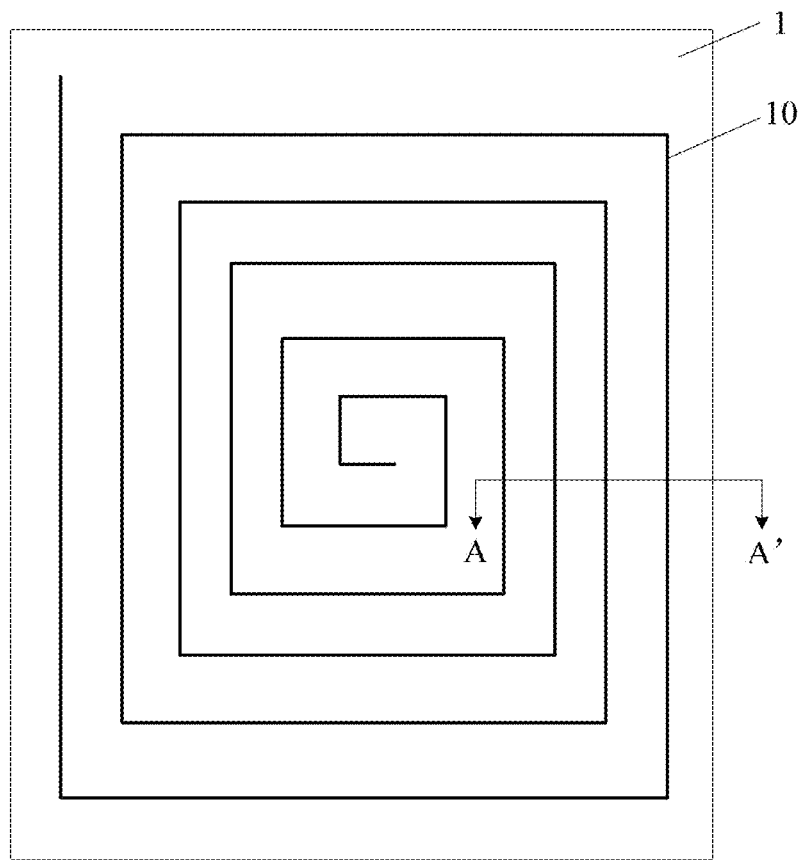
FIG. 1a is a first schematic structural diagram of a display panel according to an embodiment of this disclosure in a top view.
Figure 1B:
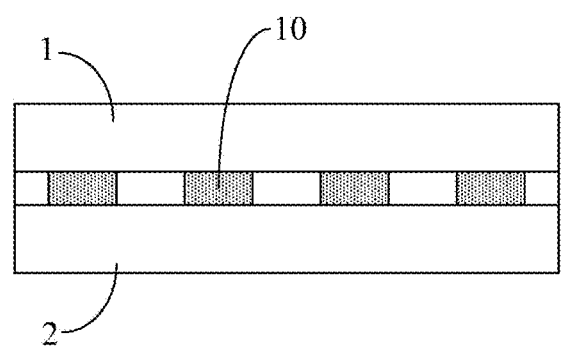
FIG. 1b is a schematic structural diagram of a display panel as illustrated in FIG. 1a in a sectional view along AA'.

Referring to FIG. 1a and FIG. 1b, a display panel according to an embodiment of this disclosure can include: an array substrate 2, an opposite substrate 1 opposite to the array substrate 2, and a charging coil 10 between the array substrate 2 and the opposite substrate 1. The charging coil 10 is configured to generate electrical energy to the display panel through electromagnetic induction.

In the display panel according to the embodiment of this disclosure, the charging coil configured to generate electrical energy through electromagnetic induction is arranged between the array substrate and the color filter substrate, so that the charging coil for charging a battery is integrated inside the display panel to thereby avoid a wireless charging component from being arranged separately on a main board. When the display panel according to the embodiment of this disclosure is applied to a display device, then the display device may be provided with a wireless charging function, but also the thickness of the display device may be reduced, thus making the display device with the wireless charging function thin and lightweight. Furthermore the charging coil is integrated inside the display panel to thereby dispense with the wireless charging component so as to lower a cost.

Figure 2:
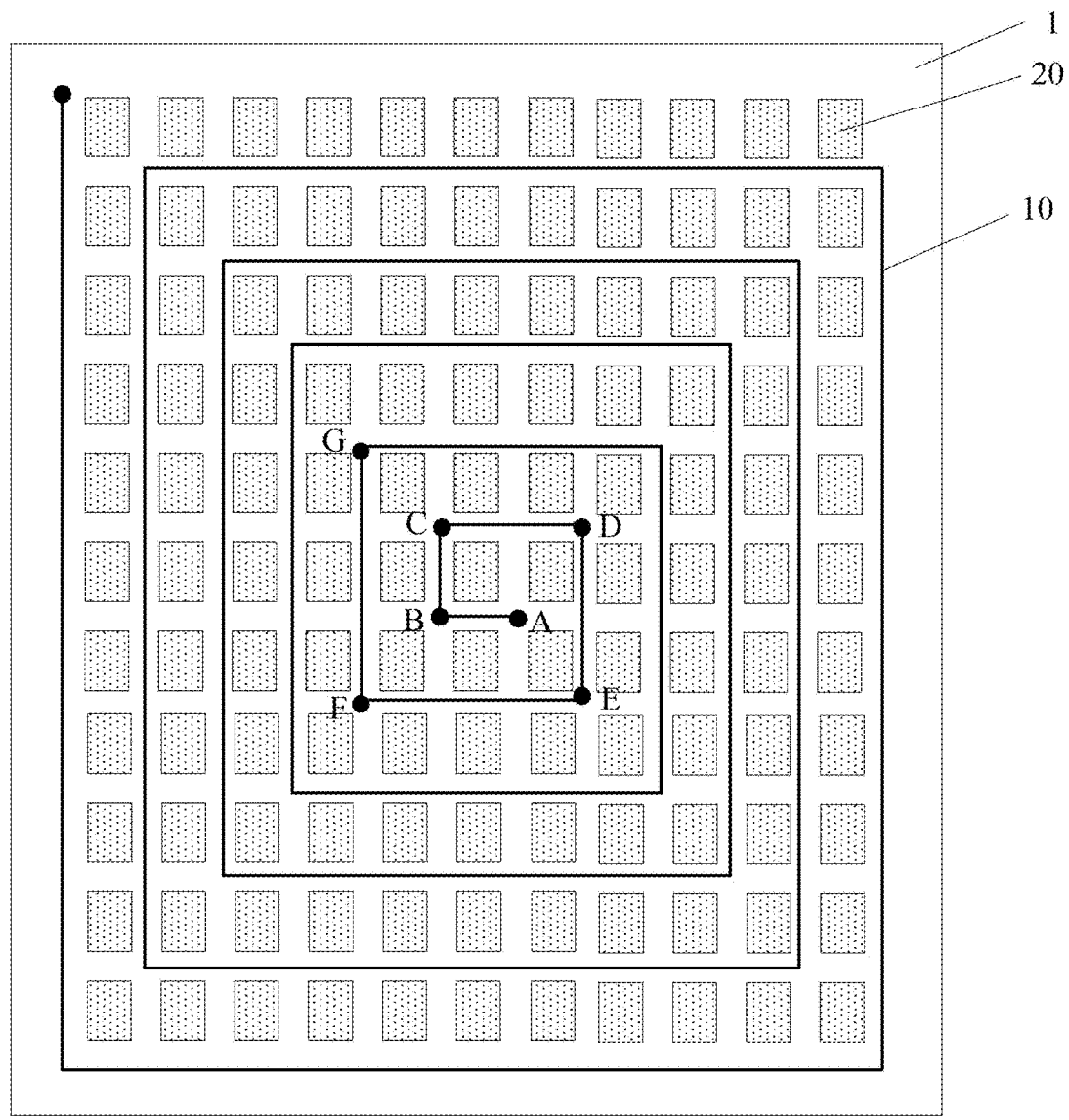
FIG. 2 is a second schematic structural diagram of the display panel according to the embodiment of this disclosure in a top view.

In a specific implementation, in the embodiment of this disclosure, as illustrated in FIG. 2, the display panel can include a plurality of pixel elements 20, and the orthographic projection of the charging coil 10 on the opposite substrate 1 does not overlap with the orthographic projections of the pixel elements 20 on the opposite substrate 1, thus alleviating the charging coil 10 from affecting a display effect of the display panel.

It shall be noted that respective coil sections of the charging coil can be arranged in a helical pattern based upon the electromagnetic induction. The helical pattern of the respective coil sections of the charging coil may not be smooth due to a limited process precision, so in a specific implementation, in the embodiment of this disclosure, as illustrated in FIG. 2, the charging coil 10 can include a plurality of sub-charging coil segments connected in sequence, and each sub-charging coil segment is located in a gap between adjacent pixel elements 20, so that the plurality of sub-charging coil segments can be electrically connected in sequence to form the charging coil in a square helical pattern. Furthermore the pixel elements 20 can be distributed in an array, and the charging coil 10 can be located in a gap between two adjacent rows or columns of pixel elements 20. For example, the charging coil 10 includes sub-charging coil segments A-B, B-C, C-D, D-E, E-F, F-G etc., connected in sequence, and each sub-charging coil segment is located in a gap between two adjacent rows or columns of pixel elements 20.

Furthermore in a specific implementation, in the embodiment of this disclosure, the respective sub-charging coil segments can be arranged at the same layer, and made of the same material. Since it is difficult to arrange the charging coil exactly on a plane due to the limited process precision, in the embodiment of this disclosure, the charging coil is substantially arranged at the same layer in one pattering process so that the charging coil can be arranged in a planar helical pattern to further reduce the thickness of the display panel. In a specific implementation, the material of the charging coil 10 can be metal, e.g., gold, silver, copper, aluminum, etc.

Generally the process of a Liquid Crystal Display (LCD) panel is mature technology, and in a specific implementation, the display panel according to the embodiment of this disclosure can be an LCD panel, so that a liquid crystal layer is further encapsulated between the array substrate and the opposite substrate, and pixel electrodes of the respective pixel elements, and Thin Film Transistors (TFTs) for controlling the pixel electrodes to be charged are further arranged on the array substrate.

An Organic Light-Emitting (OLED) display panel generally has the advantages of low power consumption, a low production cost, self-emission, a wide angle of view, a high response speed, etc., and in a specific implementation, the display panel according to the embodiment of this disclosure can alternatively be an OLED display panel, so that OLEDs of the respective elements, and pixel circuits for driving the OLEDs to emit light are further arranged on the array substrate. Furthermore only the array substrate, or both the array substrate and the opposite substrate may be arranged in the OLED display panel, although the embodiment of this disclosure will not be limited thereto.

Figure 3:
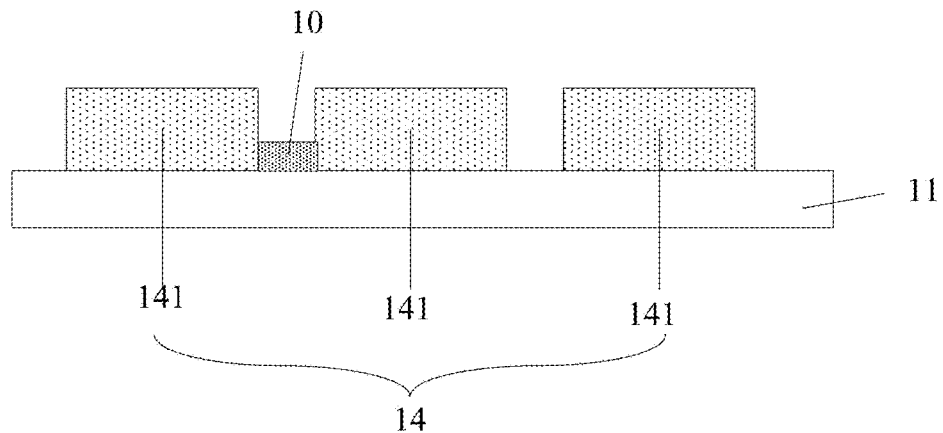
FIG. 3 is a first schematic structural diagram of an opposite substrate according to an embodiment of this disclosure in a sectional view.

In some possible implementation, since a large number of electrical signal lines are generally arranged in the array substrate, so the charging coil 10 can be located in the opposite substrate. In a specific implementation, as illustrated in FIG. 3, the opposite substrate can include a first base substrate 11, and the charging coil 10 can be located on the side of the first base substrate 1 facing the opposite substrate.

Optionally in a specific implementation, a color filter layer is further arranged on the opposite substrate 1, and the color filter layer can include color-resist elements 14 in the respective pixel elements. The charging coil 10 includes a plurality of sub-charging coil segments connected in sequence, and each sub-charging coil segment is located in a gap between adjacent color-resist elements. Specifically as illustrated in FIG. 2 and FIG. 3, the charging coil 10 is located in a gap between two adjacent rows or columns of color-resist elements 14. Specifically, for example, the charging coil 10 includes sub-charging coil segments A-B, B-C, C-D, D-E, E-F, F-G etc., connected in sequence, and each sub-charging coil segment is located in a gap between two adjacent rows or columns of color-resist elements 14. Specifically as illustrated in FIG. 3, each color-resist element 14 can include a plurality of different color sub-color-resist elements 141. As illustrated in FIG. 3, for example, each color-resist element 14 can include three different color sub-color-resist elements 141, where the three different color sub-color-resist elements 141 can include a red sub-color-resist element, a green sub-color-resist element, and a blue sub-color-resist element. Of course, each color-resist element can alternatively include four or five sub-color-resist elements, although the embodiment of this disclosure will not be limited thereto. Furthermore each sub-charging coil segment can be located in a gap between any two sub-color-resist elements 141 of each color-resist element 14.

Figure 4:
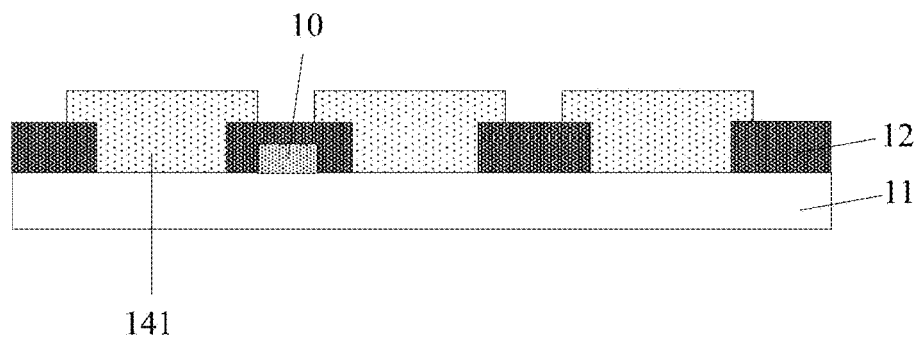
FIG. 4 is a second schematic structural diagram of the opposite substrate according to the embodiment of this disclosure in a sectional view.

In a specific implementation, as illustrated in FIG. 4, the display panel can further include a black matrix 12 located on the side of the first base substrate 11 facing the array substrate. The orthographic projection of the black matrix 12 on the first base substrate 11 cover the orthographic projection of the charging coil 10 on the first base substrate 11.

In a specific implementation, as illustrated in FIG. 4, the charging coil 10 can be located between the first base substrate 11, and the layer where the black matrix 12 is located. In the embodiment of this disclosure, the first base substrate can be a glass substrate, and the material of the charging coil 10 can be metal, so the metal charging coil 10 can be arranged directly on the glass substrate to thereby improve the adherence of the charging coil 10 to the glass substrate so as to provide the charging coil 10 with good charging performance.

Figure 5:
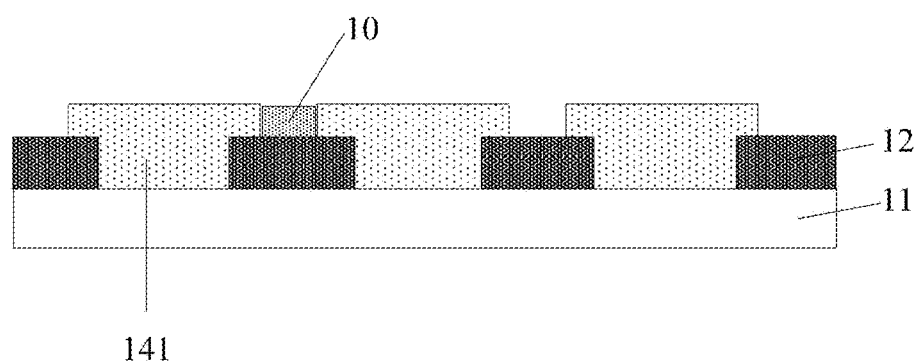
FIG. 5 is a third schematic structural diagram of the opposite substrate according to the embodiment of this disclosure in a sectional view.

In a specific implementation, as illustrated in FIG. 5, the charging coil 10 can alternatively be located on the side of the layer where the black matrix 12 is located, away from the first base substrate 11. When firstly the charging coil 10 is formed directly on the base substrate 15, and then the black matrix 12 is formed on the charging coil 10, in order to display an image on the display panel, ambient light can be firstly incident directly on the charging coil 10 through the first base substrate 11, but since the material of the charging coil 10 is metal, the ambient light incident on the charging coil 10 can be reflected, thus discouraging the user from watching the display panel. Accordingly in the embodiment of this disclosure, firstly the black matrix is formed on the base substrate 15, and then the charging coil 10 is formed on the black matrix 12, so that the user may not be discouraged from watching the display panel because the ambient light is reflected by the charging coil 10 while the image is being display on the display panel.

In a specific implementation, as illustrated in FIG. 4 and FIG. 5, the black matrix 12 can be located between the sub-color-resist elements 141 and the first base substrate 11, and the black matrix 12 can be arranged between every two adjacent sub-color-resist elements 141.

Figure 6:
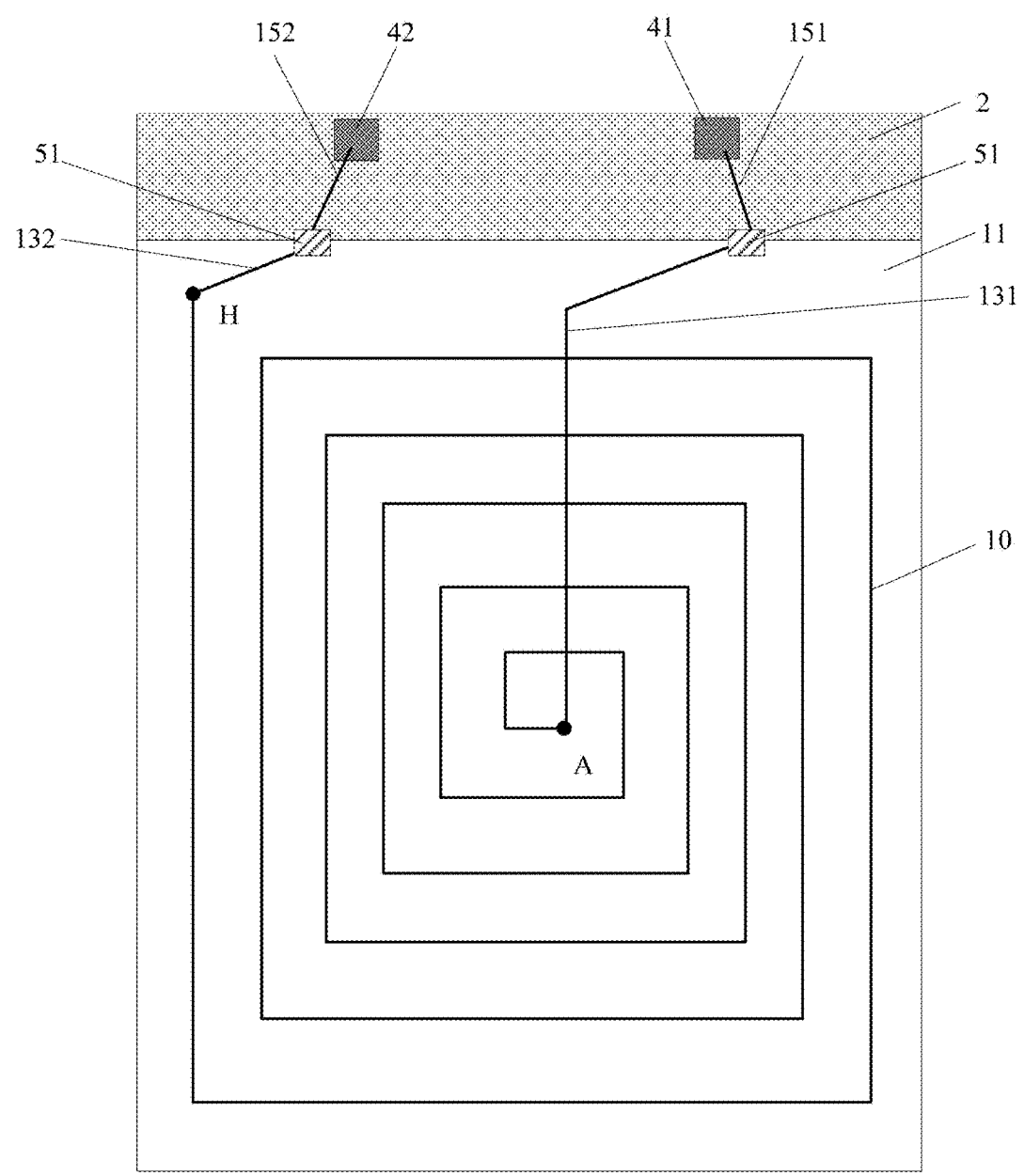
FIG. 6 is a third schematic structural diagram of the display panel according to the embodiment of this disclosure in a top view.
Figure 7:
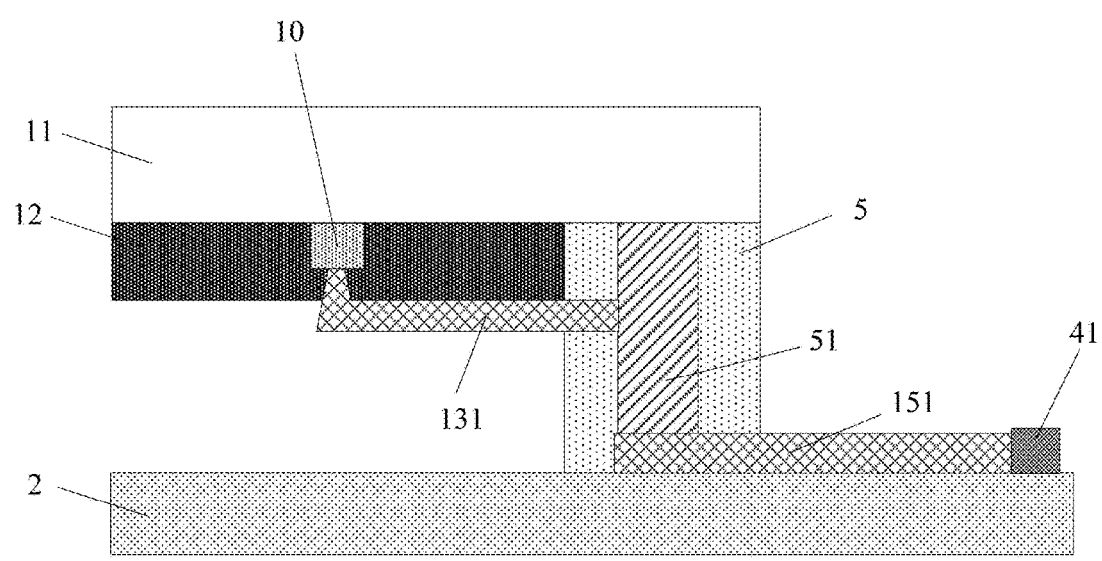
FIG. 7 is a schematic structural diagram of a part of the display panel according to the embodiment of this disclosure in a sectional view.

In a specific implementation, as illustrated in FIG. 6 and FIG. 7, the display panel can further include two charging terminals 41 and 42 located on the array substrate 2. One charging terminal 41 corresponds to an inner end A of the charging coil 10, and the other charging terminal 42 corresponds to an outer end H of the charging coil 10. The outer end H and the inner end A of the charging coil 10 are electrically connected respectively with their corresponding charging terminals, that is, the inner end A of the charging coil 10 is electrically connected with the charging terminal 41, and the outer end H of the charging coil 10 is electrically connected with the charging terminal 42.

In a specific implementation, as illustrated in FIG. 6 and FIG. 7, the display panel can further include: a first coil lead 131 corresponding to the inner end A, a second coil lead 132 corresponding to the outer end H, and an insulation layer located between the layer where the first coil lead 131 is located, and the layer where the charging coil 10 is located. The inner end A and the outer end H of the charging coil 10 are electrically connected with the first coli lead 131 and the second coil lead 132 respectively through via-holes running through the insulation layer, the first coil lead 131 is electrically connected with the charging terminal 41 corresponding to the inner end A, and the second coil lead 132 is electrically connected with the charging terminal 42 corresponding to the outer end H, so that the first coil lead 131 is located at a different layer from the charging coil 10, and the first coil lead 131 is connected with the inner end A of the charging coil 10 through the via-hole. In a specific implementation, the second coil lead 132 can be arranged at the same layer as the charging coil 10, and made of the same material as the charging coil 10, so that the second coil lead 132 is electrically connected directly with the outer end H of the charging coil 10. Of course, the second coil lead 132 can alternatively be arranged at the same layer as the first coil lead 131, and made of the same material as the second coil lead 131, so that the second coil lead 132 is connected with the outer end H of the charging coil 10 through the via-hole.

In a specific implementation, in the embodiment of this disclosure, as illustrated in FIG. 7, the first coil lead 131 can be located on the side of the black matrix 12 away from the first base substrate 11, and the charging coil 10 can be located between the black matrix 12 and the first base substrate 11, so that the insulation layer can be the layer where the black matrix 12 is located. In this way, the insulation layer may not be additionally arranged to thereby make the display panel thin and lightweight. Of course, the charging coil 10 can alternatively be located on the side of the black matrix 12 away from the first base substrate 11, and the first coil lead 131 can be located between the black matrix 12 and the first base substrate 11, although the embodiment of this disclosure will not be limited thereto.

In a specific implementation, in the embodiment of this disclosure, as illustrated in FIG. 7, the sealant 5 can be further arranged between the array substrate 2 and the first base substrate 11, so that when the display panel is an LCD panel, the liquid crystal layer can be sealed with the sealant 5.

Furthermore in a specific implementation, in the embodiment of this disclosure, as illustrated in FIG. 6 and FIG. 7, a first charging connection line 151 and a second charging connection line 152 are further arranged on the array substrate 2. The first charging connection line 151 has one end electrically connected with the first coil lead 131, and the other end electrically connected with the charging terminal 41, and the second charging connection line 152 has one end electrically connected with the second coil lead 132, and the other end electrically connected with the charging terminal 42. Furthermore since the first coil lead 131 and the second coil lead 132 are arranged on the first base substrate 11, the sealant 5 is punched so that the first coil lead 131 is electrically connected with the first charging connection line 151 through the via-hole running through the sealant 5, and the second coil lead 132 is electrically connected with the second charging connection line 152 through the via-hole running through the sealant 5. Furthermore the via-hole in the sealant 5 can be filled with conductive adhesive 51 so that the first coil lead 131 is electrically connected with the first charging connection line 151, and the second coil lead 132 is electrically connected with the second charging connection line 152. In a specific implementation, the material of the conductive adhesive can be silver paste or silver adhesive.

Figure 8:
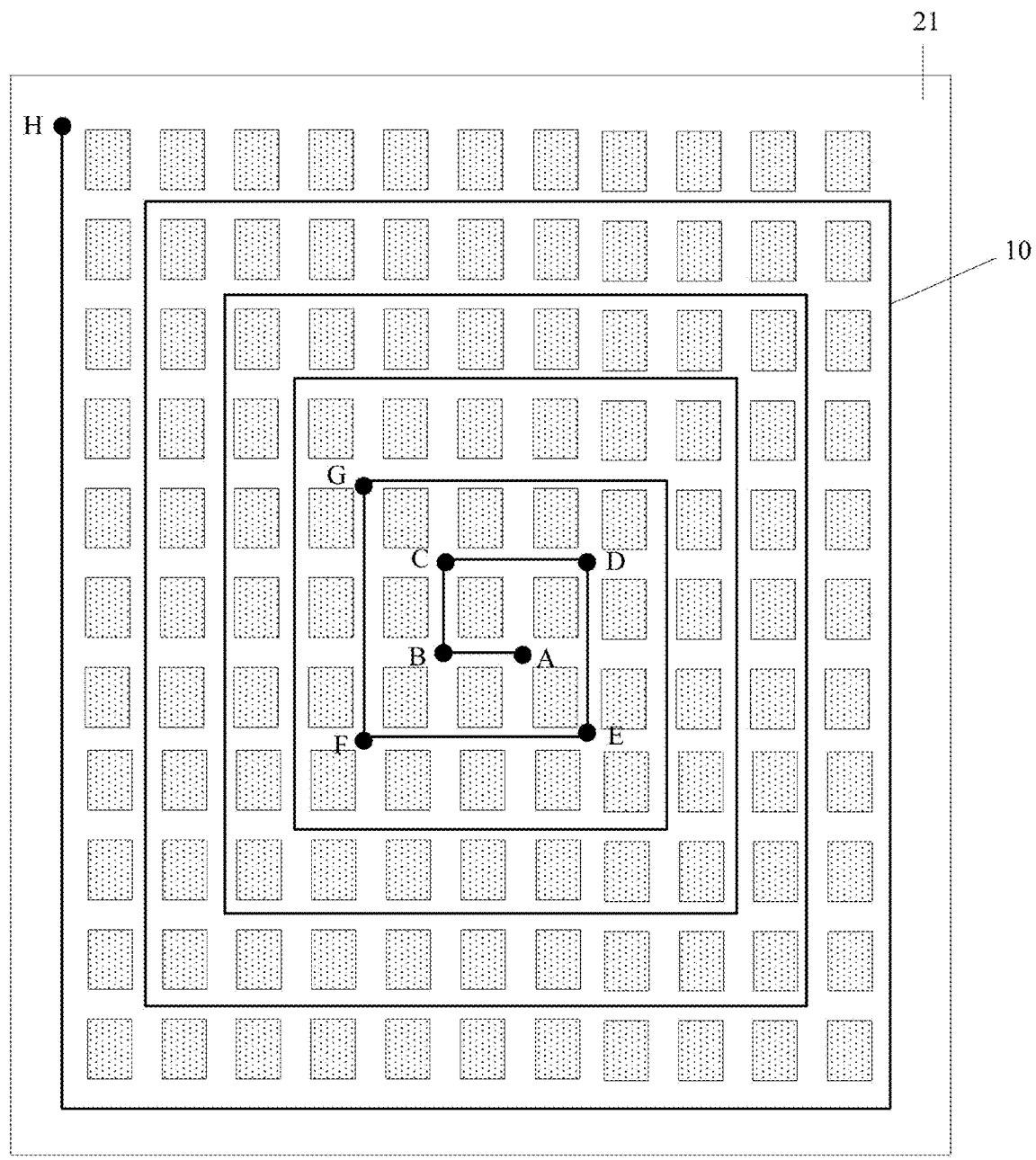
FIG. 8 is a first schematic structural diagram of an array substrate according to an embodiment of this disclosure in a top view.
Figure 9:
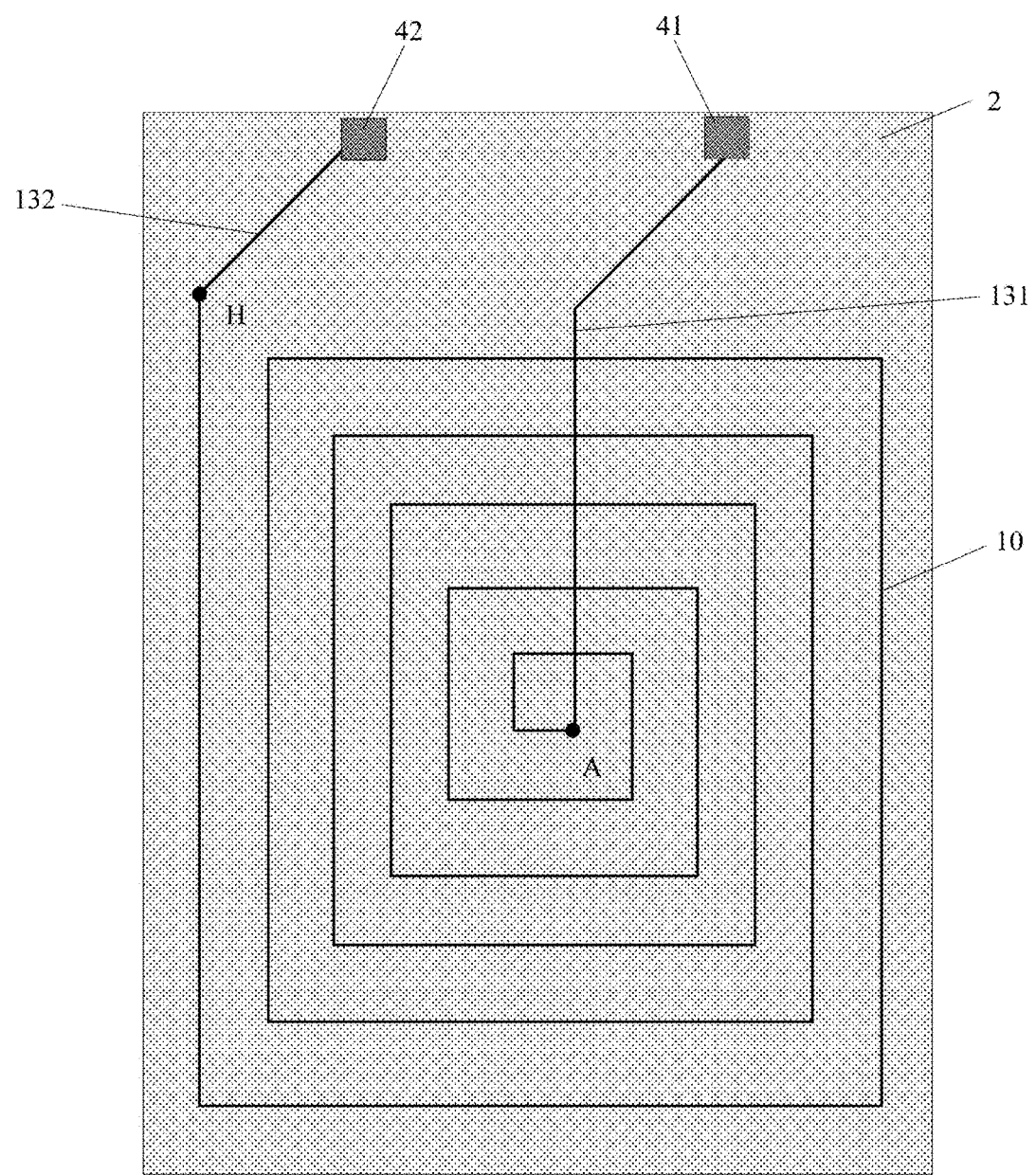
FIG. 9 is a second schematic structural diagram of the array substrate according to the embodiment of this disclosure in a top view.

In some other possible implementation, in a specific implementation, in the embodiment of this disclosure, the charging coil 10 can alternatively be located on the array substrate. Specifically as illustrated in FIG. 8 and FIG. 9, the array substrate 2 can include a second base substrate 21, and the charging coil 10 can be located on the side of the second base substrate 21 facing the opposite substrate. The array substrate 2 is further arranged with a first coil lead 131 corresponding to an inner end A of the charging coil 10, a second coil lead 132 corresponding to an outer end A of the charging coil 10, and an insulation layer located between the layer where the first coil lead 131 is located, and the layer where the charging coil 10 is located. The inner end A and the outer end H of the charging coil 10 are electrically connected with the first coli lead 131 and the second coil lead 132 respectively through via-holes running through the insulation layer, the first coil lead 131 is electrically connected with the charging terminal 41 corresponding to the inner end A, and the second coil lead 132 is electrically connected with the charging terminal 42 corresponding to the outer end H, so that the first coil lead 131 is located at a different layer from the charging coil 10, and the first coil lead 131 is connected with the inner end A of the charging coil 10 through the via-hole. In a specific implementation, the second coil lead 132 can be arranged at the same layer as the charging coil 10, and made of the same material as the charging coil 10, so that the second coil lead 132 is electrically connected directly with the outer end H of the charging coil 10. Of course, the second coil lead 132 can alternatively be arranged at the same layer as the first coil lead 131, and made of the same material as the second coil lead 131, so that the second coil lead 132 is connected with the outer end H of the charging coil 10 through the via-hole.

In a specific implementation, the charging coil can directly contact with the second base substrate. The second base substrate is generally a glass substrate, and since the metal coil is generally attached easily onto the glass substrate, the charging coil is arranged directly on the surface of the second base substrate so that the formed charging coil can be adhered firmly onto the second base substrate. Of course, other layers, e.g., respective functional layers of thin film transistors, can be further formed above the charging coil on the array substrate, although the embodiment of this disclosure will not be limited thereto.

Furthermore in order to improve a charging effect, in some other possible implementation, in a specific implementation, both the array substrate and the opposite substrate can be provided with the charging coil 10. Reference can be made to the implementation above for a specific implementation thereof, so a repeated description thereof will be omitted here.

Based upon the same inventive idea, an embodiment of this disclosure further provides a method for fabricating a display panel. The fabricating method can include: forming a charging coil between an array substrate and an opposite substrate, where the charging coil is configured to generate electrical energy through electromagnetic induction.

Figure 10:
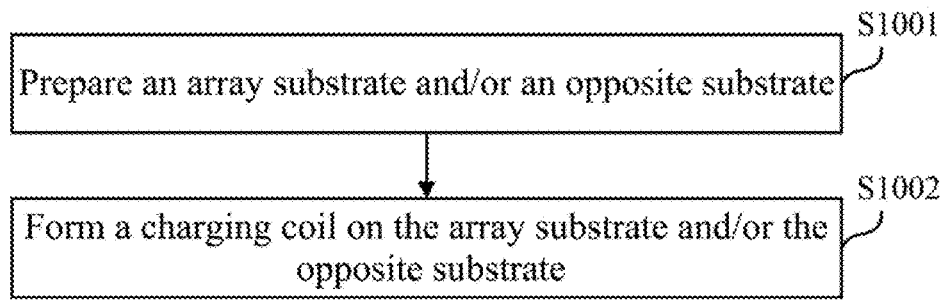
FIG. 10 is a schematic flow chart of a method for fabricating a display panel according to an embodiment of this disclosure.

In a specific implementation, as illustrated in FIG. 10, the fabricating method can include the following steps.

The step S1001 is to prepare an array substrate and/or an opposite substrate.

The step S1002 is to form a charging coil on the array substrate and/or the opposite substrate.

Figure 11:
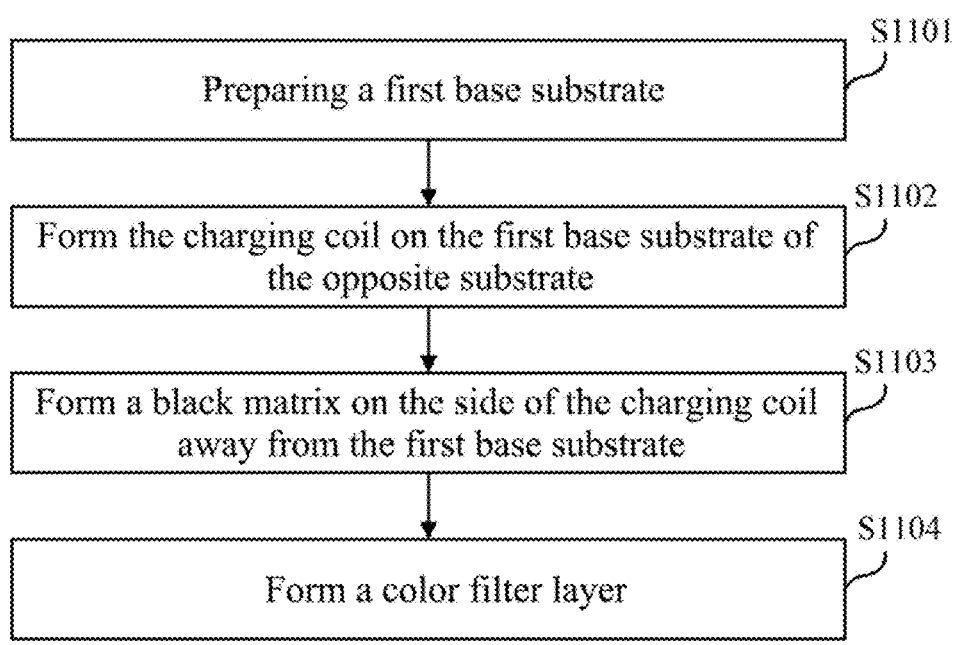
FIG. 11 is a schematic flow chart in details of the method for fabricating a display panel according to the embodiment of this disclosure.

In a specific implementation, the charging coil is formed on the opposite substrate, and as illustrated in FIG. 11, in the fabricating method according to the embodiment of this disclosure, the step of preparing the opposite substrate specifically includes the step S1101 of preparing a first base substrate. The step of forming the charging coil on the opposite substrate specifically includes the step S1102 of forming the charging coil on the first base substrate of the opposite substrate. Furthermore after the charging coil is formed on the first base substrate, the method can further include the step S1103 of forming a black matrix on the side of the charging coil away from the first base substrate, where the orthographic projection of the black matrix on the first base substrate cover the orthographic projection of the charging coil on the first base substrate. Furthermore after the black matrix is formed, the fabricating method can further include the step S1104 of forming a color filter layer on the black matrix away from the first base substrate, where the color filter layer can include a plurality of color-resist elements located in respective pixel elements, and the charging coil can include a plurality of sub-charging coil segments connected in sequence, where each sub-charging coil segment is located in a gap between two adjacent rows or columns of color-resist elements.

Optionally the step S1102 of forming the charging coil on the first base substrate of the opposite substrate can specifically include: forming the charging coil on the first base substrate using a first mask, where the first mask is a mask obtained by adding a plurality of first slit openings extending in a first direction to the pattern of a second mask, where the second mask is a mask for forming touch signal lines of the display panel, the second mask includes a plurality of second slit openings extending in a second direction, the first slit openings and a part of the second slit openings are combined into a helical opening pattern matching with the charging coil, and the second direction is perpendicular to the first direction. In the embodiment of this disclosure, the helical charging coil is formed on the base substrate using the first mask, where the first mask is a mask obtained by adding the plurality of first slit openings extending in the first direction to the pattern of the second mask, where the second mask is the mask for forming the touch signal lines of the display panel, and the second mask includes the plurality of second slit openings extending in the second direction, so that the charging coil can be fabricated on the base substrate without adding any new mask, so as not to increase a cost of fabricating the display panel.

It shall be noted that since the display panel is generally further arranged with a touch function, for example, the display panel includes a plurality of touch electrodes arranged in an array, and touch leads connected with the respective touch electrodes in a one-to-one manner. Specifically the plurality of touch leads can extend in the same direction, and for example, the respective touch leads extend in the same direction as data lines. Correspondingly the touch leads shall be fabricated using the second mask arranged with the plurality of second slit openings extending in the second direction. In the embodiment of this disclosure, the second mask can be reused, that is, the plurality of first slit openings extending in the first direction are added to the second mask. Of course, since there are different sizes of the respective sub-charging coil segments of the charging coil, only a part of the second slit openings may be applied, but the first slit openings, and the part of the second slit openings shall be combined into a helical opening pattern to thereby fabricate the charging coil.

Based upon the same inventive idea, an embodiment of this disclosure further provides a display device which can include the display panel according to the embodiment of this disclosure. The display device can address the problem under a similar principle to the display panel above, reference can be made to the implementation of the display panel above for an implementation of the display device, and a repeated description thereof will be omitted here.

Figure 12:
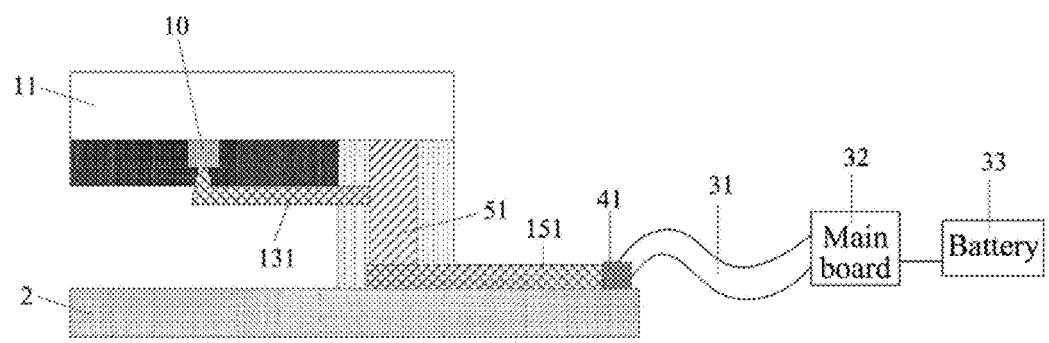
FIG. 12 is a schematic structural diagram of a display device according to an embodiment of this disclosure.

In a specific implementation, in the embodiment of this disclosure, as illustrated in FIG. 12, the display device can further include: a flexible printed circuit 31, a main board 32 electrically connected with the flexible printed circuit 31, and a battery 33 electrically connected with the main board 32. Two charging terminals 41 on the array substrate 2 (the charging terminals 41 are illustrated only by way of an example) are electrically connected with the main board 32 through the flexible printed circuit 31, and electrically connected with the battery 33 through the main board 32.

Specifically taking the charging coil being arranged on the first base substrate 11 of the opposite substrate as an example, as illustrated in FIG. 12, and the two ends (A and H) of the charging coil 10 are electrically connected with the two charging connection lines (the first charging connection line 151 and the second charging connection line 152) of the array substrate 2 respectively through the conductive adhesive 51 through the two coil leads (the first coil lead 131 and the second coil lead 132), connected with the corresponding charging terminals 41 and 42 through the two charging connection lines of the array substrate 2, and further electrically connected with the flexible printed circuit 31 through the charging terminals 41 and 42 to thereby be connected with the main board 32 through the flexible printed circuit 31, and connected with the battery 33 through the main board 32 to charge the battery 33 through electromagnetic induction. It shall be noted that FIG. 12 illustrates a schematic diagram of the opposite substrate 1 stacked above the array substrate 2 by way of an example.

Based upon the same inventive idea, an embodiment of this disclosure further provides a method for charging the display device according to the embodiment of this disclosure, where the charging method can include: charging the display device in another time than a display time and a touch time.

It shall be noted that the display device can generally operate in a display time, a touch time, and a blanking time, where a display function is performed in the display time, and a touch performance is performed in the touch time. In the charging method according to the embodiment of this disclosure, the charging function of charging the batter can be performed in the blanking time so as not to affect the display and touch functions.

Advantageous effects of the embodiments of the invention are as follows: in the display panel and a method for fabricating the same, and the display device and the method for charging the same according to the embodiments of this disclosure, the charging coil configured to generate electrical energy through electromagnetic induction is arranged between the array substrate and the color filter substrate so that the charging coil for charging a battery is integrated inside the display panel to thereby avoid a wireless charging component from being arranged separately on the main board. When the display panel according to the embodiment of this disclosure is applied to the display device, then the display device may be provided with the wireless charging function, but also the thickness of the display device may be reduced, thus making the display device with the wireless charging function thin and lightweight. Furthermore the charging coil is integrated inside the display panel to thereby dispense with the wireless charging component so as to lower a cost.

Evidently those skilled in the art can make various modifications and variations to the invention without departing from the spirit and scope of the invention. Thus the invention is also intended to encompass these modifications and variations thereto so long as the modifications and variations come into the scope of the claims appended to the invention and their equivalents.

The invention claimed is:

1. A display panel, comprising:
an array substrate;
an opposite substrate opposite to the array substrate; and
a charging coil between the array substrate and the opposite substrate;
wherein the charging coil is configured to generate electrical energy to the display panel through electromagnetic induction;
the display panel further comprises: a display area and a peripheral circuit area surrounding the display area, an orthographic projection of the display area on the array substrate does not overlap with an orthographic projection of the peripheral circuit area on the array substrate;
the display area comprises a plurality of pixel elements, at least part of the charging coil is in the display area; an orthographic projection of the charging coil on the opposite substrate does not overlap with orthographic projections of the plurality of the pixel elements on the opposite substrate;
the charging coil comprises a plurality of sub-charging coil segments connected in sequence, and at least part of the plurality of sub-charging coil segments is located in a gap between adjacent pixel elements;
wherein the opposite substrate comprises a first base substrate, and the charging coil is located on a side of the first base substrate facing the array substrate;
the display panel further comprises: a black matrix on the side of the first base substrate facing the array substrate, wherein an orthographic projection of the black matrix on the first base substrate covers an orthographic projection of the charging coil on the first base substrate;
wherein the charging coil is located between the first base substrate and a layer where the black matrix is located;
the display panel further comprises: two charging terminals on the array substrate, wherein one of the two charging terminals corresponds to an inner end of the charging coil, and the other charging terminal corresponds to an outer end of the charging coil;
and the outer end and the inner end of the charging coil are electrically connected respectively with their corresponding charging terminals;
the display panel further comprises: a first coil lead corresponding to the inner end, a second coil lead corresponding to the outer end, and an insulation layer between a layer where the first coil lead is located and a layer where the second coil lead is located;
wherein the inner end and the outer end are electrically connected with the first coil lead and the second coil lead respectively through via-holes running through the insulation layer, the first coil lead is electrically connected with the charging terminal corresponding to the inner end, and the second coil lead is electrically connected with the charging terminal corresponding to the outer end;
wherein the insulation layer is the black matrix.

2. The display panel according to claim 1, wherein the pixel elements are arranged in an array, and the charging coil is located in a gap between two adjacent rows or columns of the pixel elements.

3. The display panel according to claim 1, wherein the plurality of sub-charging coil segments are arranged at a same layer, and made of a same material.

4. The display panel according to claim 1, wherein the charging coil is located on a side of the layer where the black matrix is located away from the first base substrate.

5. The display panel according to claim 1, further comprising a second base substrate, wherein the charging coil is located on a side of the second base substrate facing the opposite substrate.

6. The display panel according to claim 5, wherein the charging coil directly contacts with the second base substrate.

7. A display device, comprising the display panel according to claim 1.

8. The display device according to claim 7, wherein the display device further comprises: a flexible printed circuit, a main board electrically connected with the flexible printed circuit, and a battery electrically connected with the main board; and
two charging terminals on the array substrate are electrically connected with the main board through the flexible printed circuit, and electrically connected with the battery through the main board.

9. A method for fabricating the display panel according to claim 1, comprising:
forming a charging coil between an array substrate and an opposite substrate, wherein the charging coil is configured to generate electrical energy through electromagnetic induction.

10. A method for charging the display device according to claim 8, comprising: charging the battery through the charging coil in another time than a display time and a touch time.

* * * * *